(12) United States Patent
Sikka et al.

(10) Patent No.: US 8,592,970 B2
(45) Date of Patent: Nov. 26, 2013

(54) MULTICHIP ELECTRONIC PACKAGES AND METHODS OF MANUFACTURE

(75) Inventors: Kamal K. Sikka, Poughkeepsie, NY (US); Hilton T. Toy, Hopewell Junction, NY (US); Krishna R. Tunga, Wappingers Falls, NY (US); Jeffrey A. Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/169,394

(22) Filed: Jun. 27, 2011

(65) Prior Publication Data
US 2012/0326294 A1  Dec. 27, 2012

(51) Int. Cl.
*H01L 23/12* (2006.01)

(52) U.S. Cl.
USPC ............ 257/704; 257/E21.506; 257/E23.003; 438/107

(58) Field of Classification Search
USPC .................................. 438/25, 26, 54, 55, 106
See application file for complete search history.

(56) References Cited

U.S. PATENT DOCUMENTS

| | | | | |
|---|---|---|---|---|
| 5,097,385 A * | 3/1992 | Chao-Fan Chu et al. | ..... | 361/703 |
| 5,177,667 A * | 1/1993 | Graham et al. | ............... | 361/715 |
| 5,394,299 A * | 2/1995 | Chu et al. | ...................... | 361/705 |
| 5,517,753 A * | 5/1996 | Messina | ......................... | 29/841 |
| 5,623,394 A * | 4/1997 | Sherif et al. | .................. | 361/705 |
| 5,719,443 A * | 2/1998 | Messina | ........................ | 257/712 |
| 5,981,310 A * | 11/1999 | DiGiacomo et al. | .......... | 438/106 |
| 6,214,647 B1 * | 4/2001 | Di Giacomo et al. | ......... | 438/122 |
| 6,292,369 B1 | 9/2001 | Daves et al. | | |
| 6,294,408 B1 * | 9/2001 | Edwards et al. | .............. | 438/121 |
| 6,294,731 B1 | 9/2001 | Lu et al. | | |
| 6,355,499 B1 * | 3/2002 | Wu et al. | ........................ | 438/106 |
| 6,396,701 B1 * | 5/2002 | Nakamura et al. | ............ | 361/706 |
| 6,404,638 B1 * | 6/2002 | Messina | ........................ | 361/715 |
| 6,703,560 B2 | 3/2004 | Coico et al. | | |
| 6,735,081 B1 | 5/2004 | Bishop et al. | | |
| 6,850,411 B1 | 2/2005 | Patel | | |
| 6,964,885 B2 * | 11/2005 | Coico et al. | ................... | 438/122 |
| 6,999,317 B2 | 2/2006 | Chengalva et al. | | |
| 7,119,433 B2 * | 10/2006 | Corbin et al. | .................. | 257/706 |
| 7,394,659 B2 * | 7/2008 | Colgan et al. | ................. | 361/718 |
| 7,480,143 B2 * | 1/2009 | Delano et al. | ................. | 361/704 |
| 7,547,582 B2 | 6/2009 | Brunschwiler et al. | | |
| 7,629,684 B2 * | 12/2009 | Alcoe et al. | .................... | 257/720 |
| 7,651,887 B2 * | 1/2010 | Morita et al. | ................. | 438/106 |
| 7,687,894 B2 * | 3/2010 | Corbin et al. | ................. | 257/678 |

(Continued)

*Primary Examiner* — Julio J Maldonado
*Assistant Examiner* — Jaehwan Oh
(74) *Attorney, Agent, or Firm* — Matthew C. Zehrer; Roberts Mlotkowski Safran & Cole, P.C.

(57) ABSTRACT

A multi-chip electronic package and methods of manufacture are provided. The method comprises adjusting a piston position of one or more pistons with respect to one or more chips on a chip carrier. The adjusting comprises placing a chip shim on the chips and placing a seal shim between a lid and the chip carrier. The seal shim is thicker than the chip shim. The adjusting further comprise lowering the lid until the pistons contact the chip shim. The method further comprises separating the lid and the chip carrier and removing the chip shim and the seal shim. The method further comprises dispensing thermal interface material on the chips and lowering the lid until a gap filled with the thermal interface material is about a particle size of the thermal interface material. The method further comprises sealing the lid to the chip carrier with sealant.

24 Claims, 7 Drawing Sheets

(56) References Cited

U.S. PATENT DOCUMENTS

| | | | |
|---|---|---|---|
| 7,724,527 B2 | 5/2010 | Coico et al. | |
| 7,808,781 B2* | 10/2010 | Colgan et al. | 361/699 |
| 7,826,228 B2* | 11/2010 | Audet et al. | 361/704 |
| 7,833,456 B2* | 11/2010 | Farnworth | 264/272.17 |
| 7,863,103 B2* | 1/2011 | Abbott | 438/112 |
| 8,264,134 B2* | 9/2012 | Tuma et al. | 313/344 |
| 2001/0039062 A1* | 11/2001 | Marinis et al. | 438/3 |
| 2002/0017715 A1* | 2/2002 | Giacomo et al. | 257/712 |
| 2002/0030258 A1* | 3/2002 | Fukasawa et al. | 257/678 |
| 2003/0157709 A1* | 8/2003 | DiMilla et al. | 435/325 |
| 2005/0100776 A1* | 5/2005 | Brunk et al. | 429/35 |
| 2007/0065653 A1* | 3/2007 | Meguro et al. | 428/304.4 |
| 2007/0105269 A1* | 5/2007 | Maher et al. | 438/106 |
| 2009/0284921 A1* | 11/2009 | Colgan et al. | 361/699 |
| 2010/0237243 A1* | 9/2010 | Noji et al. | 250/310 |
| 2011/0221048 A1* | 9/2011 | Lim et al. | 257/675 |
| 2012/0080784 A1* | 4/2012 | Kadakia et al. | 257/704 |
| 2012/0196408 A1* | 8/2012 | Kadakia et al. | 438/126 |

* cited by examiner

"RELATED ART"

"RELATED ART"

MULTICHIP ELECTRONIC PACKAGES AND METHODS OF MANUFACTURE

FIELD OF THE INVENTION

The invention relates to semiconductor package structures and methods of manufacture and, more particularly, to multi-chip electronic packages and methods of manufacture.

BACKGROUND

Thermal management of multi-chip electronic packages is critical to ideal performance of the multi-chip electronic packages. Currently, multi-chip electronic packages encapsulate chips between a lid and chip carrier by forming a customized gap between pistons of the lid and the chips mounted on the chip carrier, and dispensing a thermal interface material (TIM) within the gap. The gap is formed by the use of a chip shim placed between pistons of the lid and the chips of the multi-chip electronic packages.

Referring to FIGS. 1a and 1b, a plurality of chips 12 are shown attached to a chip carrier 10. During assembly, a chip shim 15 is placed between pistons 16 and chip 12 in order to form a gap between the pistons 16 and the chips 12 (FIG. 1a). A lid or hat 14 (hereinafter referred to as a lid) is positioned over the chip carrier 10. The lid has "pistons" 16 that are moved such that they contact the chip shim 15. The lid 14 is then removed from the chip carrier 10, and the pistons 16 are fixedly attached to the lid 14. The chip shim 15 is removed and thermal interface material is then placed on the chips. Once the thermal interface material is on the chips 12, the chip carrier 10 and lid 14 are sealed to one another in order to encapsulate the chips 12 (FIG. 1b). As shown in FIG. 1b, the surface of the lid 14 will typically contact a surface of the chip carrier 10, in the assembled state.

The assembly process described with reference to FIGS. 1a and 1b, however, results in a large thermal interface gap between the surface of the chip 12 and the respective piston 16, e.g., on the order of about 80 microns or more. This resultant thermal interface gap is largely due to the structural constraints of the lid 14, e.g., the edges of the lid 14 contacting the surface of the chip carrier 10, when in the assembled state. More specifically, the structural constraint of the assembly physically blocks the lid from moving closer to the chip carrier 10, hence preventing the pistons from closing such thermal interface gap. And, due to this larger gap, additional large thermal interface gap, e.g., 80 microns or more, is between the pistons 16 and the chips 12 which, in turn, actually reduces the thermal performance of the Multi-chip module (MCM). That is, the added thermal paste to fill the gap between the chip 12 and the respective piston 16 with higher thermal resistance increases chip temperature in MCM.

Also, the direct load through particles between the lid 14 and the chip carrier 10 results in a load distributed more uniformly across the chip carrier 10. This reduces load and decreases on the stress on the chip carrier 10. The warpage of the lid 14 further degrades thermal performance for additional TIM between the hat and heatsink.

Accordingly, there exists a need in the art to overcome the deficiencies and limitations described hereinabove.

SUMMARY

In a first aspect of the invention, a method comprises adjusting a piston position of one or more pistons with respect to one or more chips on a chip carrier. The adjusting comprises placing a chip shim on the one or more chips on the chip carrier and placing a seal shim between a lid and the chip carrier. The seal shim is thicker than the chip shim. The lid is placed on a seal shim and then lowered on one or more pistons which contact the chip shim. The adjusting further comprises displacing the one or more pistons and lid individually until full surface contact with both the chip shim and the seal shim is established and fixing the one or more pistons to the lid in the displaced position. The method further comprises separating the lid and the chip carrier and removing the chip shim and the seal shim. The method further comprises dispensing thermal interface material on the one or more chips and lowering the lid until a gap filled with the thermal interface material where TIM gap is about a particle size of the thermal interface material. The method further comprises sealing the lid to the chip carrier with sealant between the lid and the chip carrier.

In another aspect of the invention, a method comprises placing a seal shim on at least one of a lid and a chip carrier and placing a chip shim over chips on the chip carrier. The method further comprises placing the lid and the chip carrier in proximity to one another such that pistons of the lid are in registration with chips on the chip carrier. The seal shim prevents the lid from contacting with the chip carrier. The method further comprises contacting the pistons with the chip shim, fixing the pistons to the lid in a contacted position with the chips, and moving apart the lid and the chip carrier. The method further comprises removing the seal shim and the chip shim. The method further comprises dispensing thermal interface material on the chips and placing sealant on at least one of the lid and the chip. The method further comprises moving the lid and the chip carrier together to compress the thermal interface material to a particle size between the pistons and the chips. The method further comprises sealing the lid to the chip carrier with sealant. In embodiments, the seal module is non-hermetic with polymer sealant material or can also be hermetic with solder seal.

In yet another aspect of the invention, a structure comprises a lid encapsulating at least one chip mounted on a chip carrier. A gap is between the pistons of the lid and respective ones of the chips. The gap is a particle size of thermal interface material within the gap, which contacts the pistons and the respective ones of the chips.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1A:
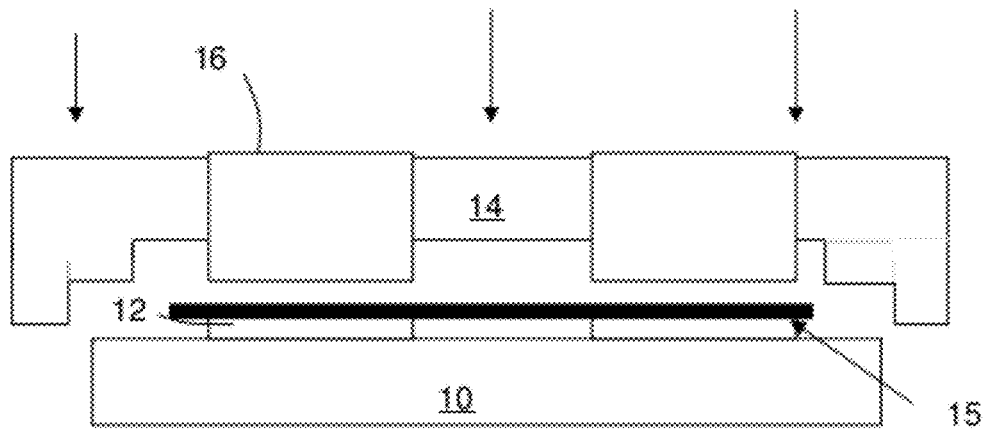
FIGS. 1a and 1b show conventional multi-chip electronic packages and methods of manufacture.
Figure 1B:
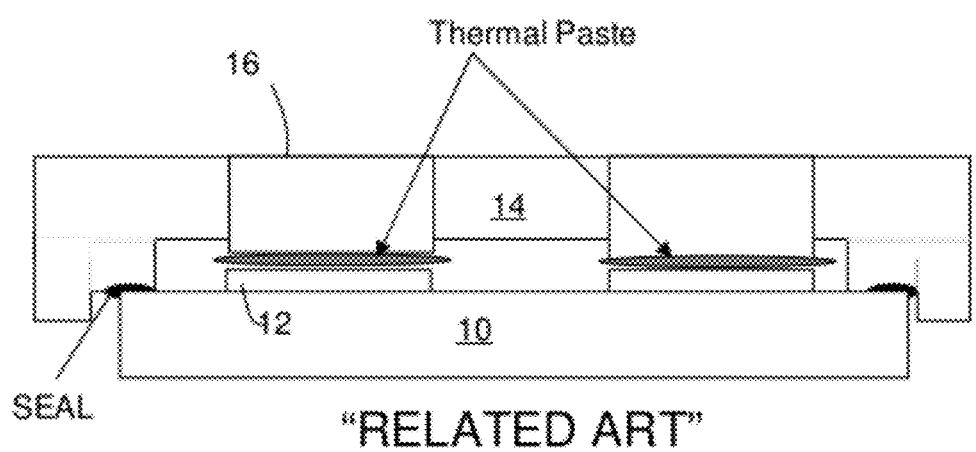

The invention relates to semiconductor structures and methods of manufacture and, more particularly, to multi-chip electronic packages and methods of manufacture. More specifically, the present invention addresses the thermal management design of multi-chip electronic packages by using a seal shim to control a thermal interface gap provided between a lid and chips (mounted on a chip carrier) of the multi-chip electronic packages. In embodiments, the seal shim is positioned between a surface of the lid and the chip carrier, during the initial stage of assembly, e.g., adjustment of the pistons of the lid. In embodiments, the seal shim is thicker than the chip shim, used in the assembly process, in order to provide a reduced thermal interface gap between the lid and the chips. In embodiments, the seal shim may have a thickness of about two or more times the thickness of the chip shim. The gap between the lid and chip can be provided with a removable standoff or any temporary structure, to provide a gap larger than the TIM gap during lid setup.

Advantageously, in embodiments, by using the seal shim of the present invention it is possible to reduce the thermal interface gap between the lid and the respective chips. In this way, it is possible to increase the thermal efficiency of the package and hence increase chip performance. For example, the thermal interface gap can be reduced to about a particle thickness contained in TIM, e.g., 30 microns. More specifically, the thermal interface gap can be reduced to about 30 microns, compared to a gap of about 80 microns in conventional assembly methodologies. Also, using the seal shim results in a uniform repeatable thermal interface gap down to the TIM particle height at multiple chip sites simultaneously. Moreover, the use of the seal shim of the present invention can reduce the TIM pumping (cycling movement), thus providing improved module lid ("hat") flatness (reduce warpage), lower stresses imposed on the chip carrier, and eliminate the use of a spar plate, in the assembly process.

It has also been found that by using the seal shims of the present invention, it is possible to, amongst other advantages:
  (i) achieve a 30 micron TIM gap with very reliable thermal data with little or no degradation on package performance or integrity;
  (ii) use any TIM material in order to achieve an increased thermal performance by TIM gap down to TIM particle size. For example, the present invention provides improved thermal resistance over existing technology of about 50% by reducing the thermal interface gap;
  (iii) create reliable low stress structures with lid and chip carrier mechanically-coupled through multiple chip sites rather than a single peripheral mechanical connection;
  (iv) decouple the lid from the chip carrier thereby reducing the distortion of the lid surface and enabling more uniform heatsink interface; and
  (v) allow the piston to bottom out on the compressed TIM without the lid contacting the chip carrier surface, thereby reducing stress on the chip carrier within the package.

Figure 2:
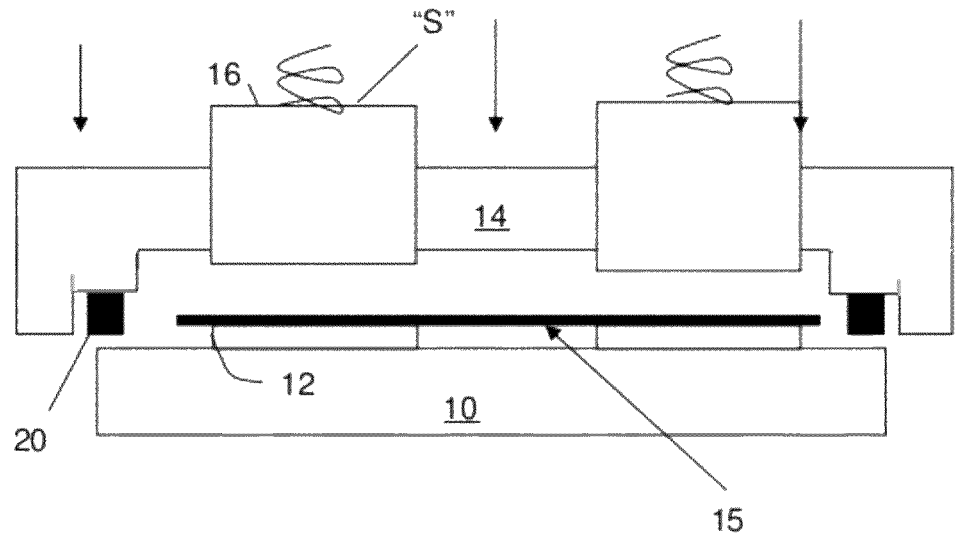
FIGS. 2-4, 5a, 5b, and 6 show stages of fabricating multi-chip electronic packages in accordance with aspects of the present invention.

FIG. 2 shows a beginning process and related structures in accordance with aspects of the invention. More specifically, FIG. 2 shows a plurality of chips 12 attached to a chip carrier 10. A lid or hat 14 (hereinafter referred to as a lid) is positioned over the chip carrier 10 such that "pistons" 16 are aligned (registered) with each of the chips 12, respectively.

The pistons 16 can be releasably attached to the lid 14 by many different methods. For example, the pistons 16 can be soldered to the lid 14 by solder, or attached by an epoxy or other adhesive. In embodiments, the pistons 16 can be made from copper, for example, and should have a same or substantially same footprint as the chips 12. The pistons 16 can be spring loaded into the lid 14 using springs or other resilient mechanisms "S" attached to the lid 14.

Still referring to FIG. 2, during assembly, a flexible chip shim 15 is placed between the pistons 16 and chips 12 in order to form a thermal interface gap between the pistons 16 and the chips 12. In embodiments, the chip shim 15 (can be attached by adhesive or mechanically) has a thickness of about 50 microns. A seal shim 20 is located on an underside surface of the lid 14 (and/or a surface of the chip carrier), preferably near an edge thereof and remote from the chips 12. The seal shim 20 can be stainless steel, brass, plastic or other stable material, for example. The lid 14 can be made from materials such as copper, aluminum, Kovar (Kovar is an iron-nickel-cobalt alloy with a coefficient of thermal expansion similar to that of hard (borosilicate) glass), AlSiC (aluminum silicon carbide), SiSiC (silicon silicon carbide), and AlN (aluminum nitride).

In embodiments, the seal shim 20 is thicker than the chip shim 15. For example, the seal shim 20 can be about 50 microns thicker than the chip shim 15; although other dimensions are also contemplated by the present invention. For example, the seal shim 20 can have a thickness of about two or more times that of the chip shim 15. In any of the embodiments, the thickness of the seal shim 20 allows more head room between the lid 14 and the chip carrier 10, compared to conventional systems. In this way, for example, the use of the seal shim 20 will allow the piston 16 to bottom out on compressed TIM without the lid 14 contacting the surface of the chip carrier 10, thereby reducing stress on the package, amongst other features and advantages described herein. Advantageously, the method and structure of the present invention is customizable for chips and chip shims of different sizes (e.g., different thickness), and shapes. Alternative methods of removable standoffs can be used instead of seal shims.

Figure 3:
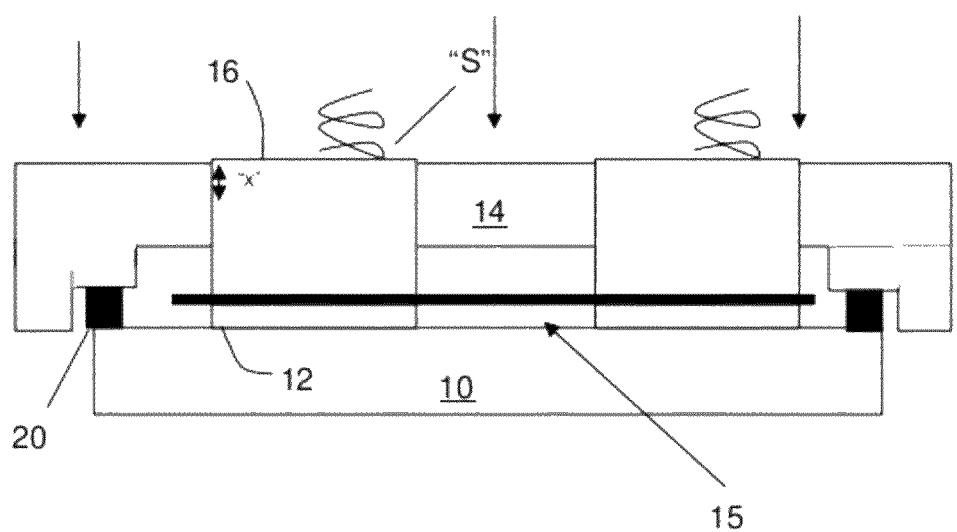

In FIG. 3, the lid 14 and/or the chip carrier 10 are moved in close proximity to one another. The pistons 16 should be aligned (registered) with each of the chips 12, respectively. As shown in FIG. 3, the distance between the lid 14 and the chip carrier 10 is constrained by the seal shim 20, since the seal shim 20 is thicker than the chip shim 15. In this way, the lid 14 and/or the chip carrier 10 will always remain separated from one another, i.e., the lid 14 will not bottom out on the chip carrier 10. Once the lid 14 and/or the chip carrier 10 are in close proximity to one another and the pistons 16 and chips 12 are aligned, the pistons 16 are released in order to come into direct contact with the chip shim 15. As shown in FIG. 3, the pistons are moved by a distance 'x', compared to the piston position shown in FIG. 2.

As described in greater detail below, the distance between the lid 14 and the chip carrier 10 (resulting from the thickness of the seal shim 20) will result in a thermal interface gap between the pistons 16 and the chips 12 of about a particle size of the TIM. The use of the seal shim 20 ensures this precise thermal gap between the pistons 16 and chips 12, regardless of the variation in height of the chips or the thickness of the chip shim. That is, the method of the present invention will ensure that there is a uniform thermal gap between each piston 16 and chip 12 for TIM to be dispensed therebetween, regardless of chip variation, as the entire lid 14 will be raised above the chip carrier 10, with the starting point being the thickness of the seal shim 20, e.g., thereby allowing the piston 16 to move sufficiently downward prior to the lid 14 contacting the chip carrier 14. This is in contrast to known methods in which a thermal interface gap between the pistons 16 and chips 12 is determined by only a chip shim. The gap using the present invention is based on the TIM particle size.

The pistons 16 can be released from the lid 14 using many different methods. For example, when the pistons 16 are soldered to the lid 14 by eutectic solder, the entire assembly can be placed in a reflow furnace to bring the solder to a melting point. When the solder reaches its melting point, the pistons 16 will be released and will move into direct contact with the chip shim 15. At this stage of processing, for example, the pistons 16 can be forced into direct contact with the chip shim 15 by the force of the springs or other resilient mechanisms "S" of a fixture or mechanism attached to the lid 14. As the assembly cools, the solder will then harden and again fix the pistons 16 to the lid 14, but now in a lowered position. The position of the pistons 16 are in a final position, with respect to the lid 14.

In the case of an adhesive or epoxy or other bonding agent, a chemical solution can be used to release the pistons 16 from the lid 14. Once the pistons 16 are released, they will move into direct contact with the chip shim 15. At this stage of processing, for example, the pistons 16 can be forced into direct contact with the chips 12 by the force of the springs or other resilient mechanisms "S" of a fixture or mechanism attached to the lid 14. In this lowered position, the pistons 16 can then be fixed to the lid 14 by, for example, adhesive or epoxy or other bonding agent (including a solder). The position of the pistons 16 are in a final position, with respect to the lid 14.

Figure 4:
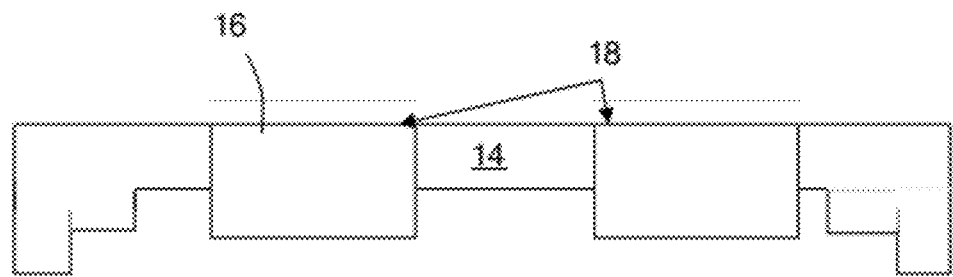

As shown in FIG. 4, the back side of the pistons 16 can be planarized to a flat surface 18 with the surface of the lid 14. In embodiments, the planarization can be performed by a mechanical planarization process such as, for example, a grinding or cutting process, well known to those of skill in the art. The planarization allows good thermal contact between the lid and an external cooling device such as a heat sink or cold plate.

Figure 5A:
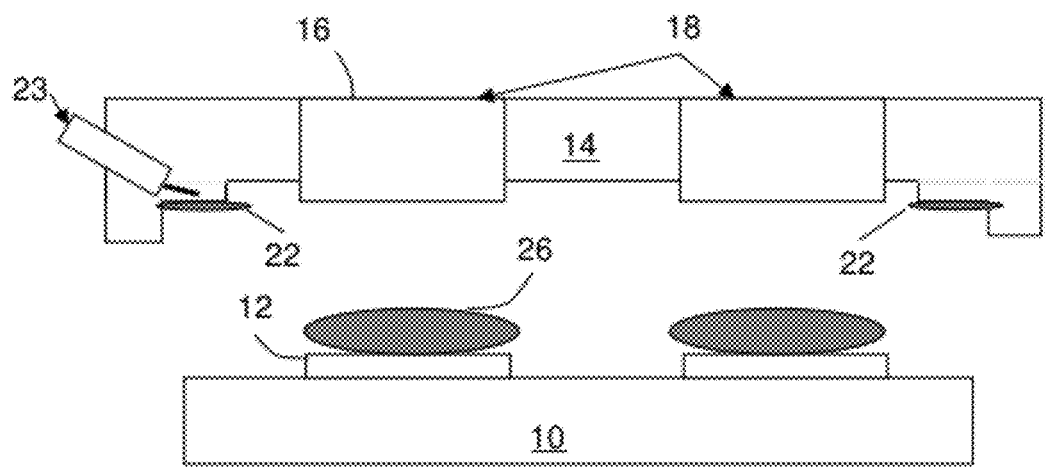
Figure 5B:
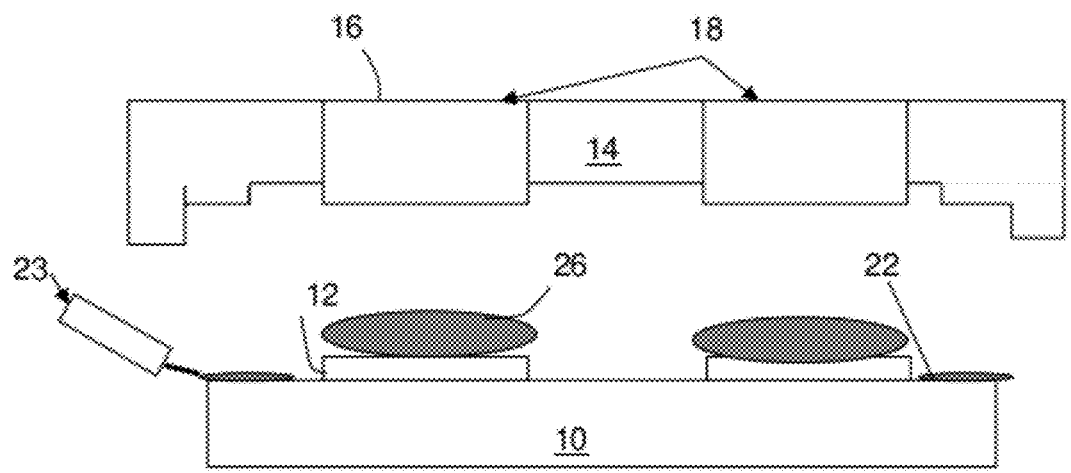

FIGS. 5a and 5b show different methods of attaching the lid 14 to the chip carrier 10. As shown in each of the embodiments, the seal shim 20 and the chip shim 15 are removed from the package, prior to final assembly. A sealant 22 is placed on either (or both) the lid 14 or the chip carrier 10, by use of a fluid dispenser needle with a pressure plunger or auger, as shown at reference numeral 23. For example, in FIG. 5a, the sealant 22 is attached to a side of the lid 14, facing the chip carrier 10. In FIG. 5b, the sealant 22 is attached to a side of the chip carrier 10, facing the lid 14. In both FIGS. 5a and 5b, the sealant 22 can be, for example, silicon, adhesive or epoxy, for example, known to those of skill in the art. In embodiments, the sealant 22 can be applied prior to or concurrently with the application of the TIM 26.

Figure 6:
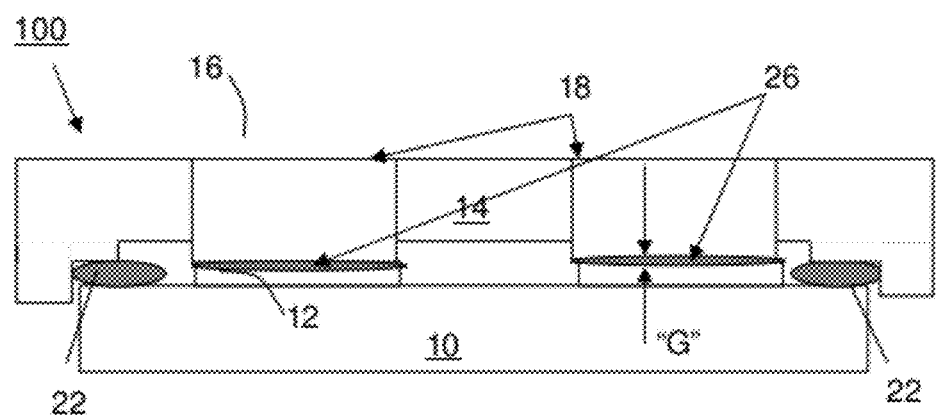

In FIG. 6, the lid 14 and chip carrier 10 are attached to one another with the sealant 22. Prior to encapsulating the chips 12 within the multi-chip electronic package 100, the TIM 26 is dispensed on the chips 12. The TIM 26 can be any conventional TIM, and will be placed within the gap formed by the combination of the seal shim 20 and chip shim 15 (due to the fact the lid (and pistons) is raised in FIG. 3). As discussed above, the method of the present invention will ensure that there is a uniform thermal interface gap "G" between each piston 16 and chip 12 for TIM to be dispensed therebetween, regardless of chip height and tilt variation, as the entire lid will be raised above the chip carrier 10. Also, as shown in FIG. 6, the use of the seal shim will allow the piston to bottom out on the compressed TIM without the lid 14 contacting the surface of the chip carrier 10, thereby reducing stress on the package. This will also reduce lid warpage, in addition to increasing the thermal performance of the package.

In embodiments, the thermal interface gap "G" is about 30 microns or a particle size of the TIM. For example, in embodiments, the thermal interface gap "G" can be customized by the particle size of the TIM. In this way, the smaller sized distance between the lid 14 and the chip 10 will accommodate a smaller amount of TIM which, in turn, increases the thermal efficiency (performance) of the package and hence increase chip performance. This is possible due to the use of the seal shim 20 maintaining a space between the lid 14 and the chip carrier 10 during the initial assembly process.

Also, as shown in FIG. 6, the lid 14 no longer makes contact with a surface of the chip carrier 10, providing many of the advantages noted above. Thus, the lid 14 and the chip carrier 10 are decoupled, thereby reducing the distortion of the lid surface and enabling more uniform heatsink interface. This also creates a reliable low stress structure with lid and chip carrier mechanically-coupled through multiple chip sites rather to than a single peripheral mechanical connection. This low stress is achieved by separating the lid 14 from the chip carrier 10 with the adhesive 22, for example.

In embodiments, the chip carrier and lid can be a non-hermetically sealed module that passes a bubble leak test with epoxy or silicone seal materials. In further embodiments, the chip carrier and lid can be a hermetic sealed module that passes fine line testing. In this embodiment, the chip carrier and lid can be rigidly connected by a solder seal, for example, eutectic Sn63/Pb37. The rigid connection can also be, for example, a metal or glass seal which makes the hermetically sealed module impermeable to the environment.

Figures 7A, 7B:
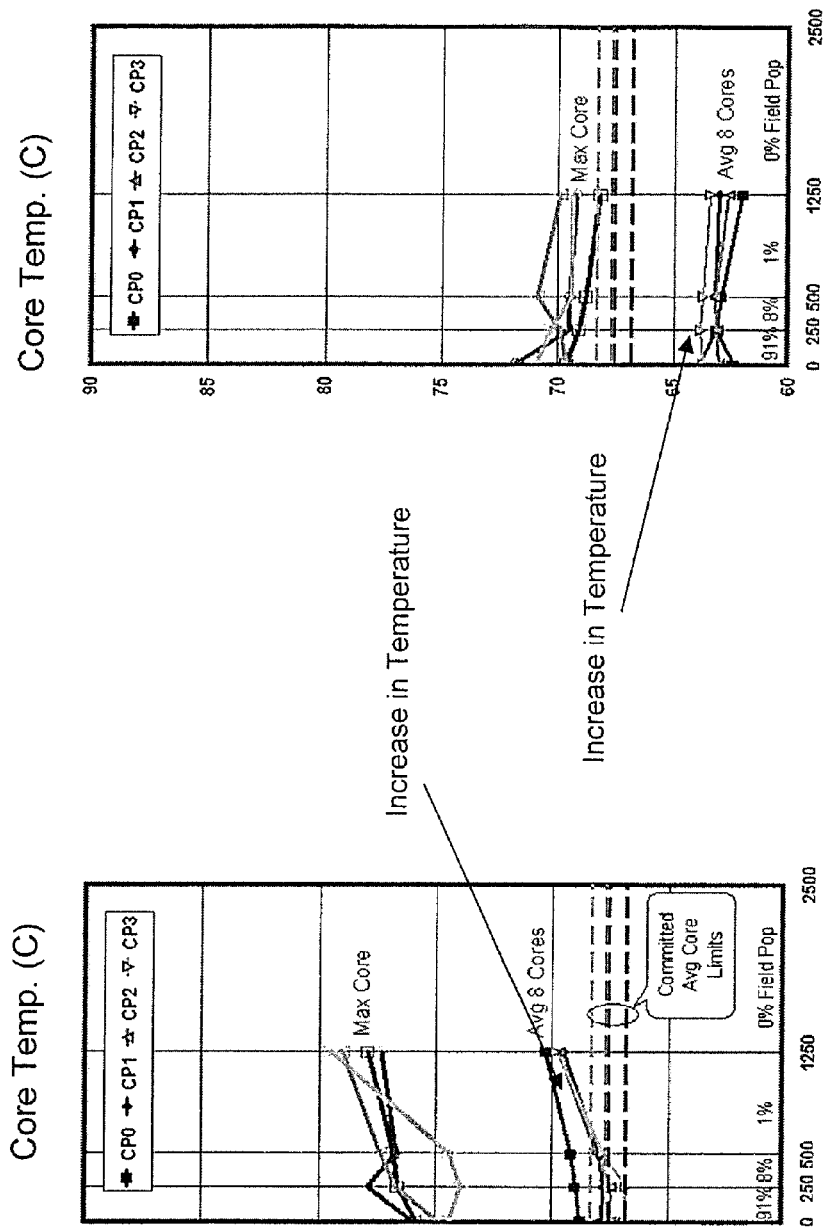
FIGS. 7a and 7b show performance graphs of a multi-chip electronic package manufactured in accordance aspects of the present invention vs. a conventional multi-chip electronic package.

FIGS. 7a and 7b show performance graphs of a multi-chip electronic package in accordance with the present invention vs. a conventional multi-chip electronic package. More specifically, FIG. 7a shows a performance graph of a conventional package of four chips (CP0, CP1, CP2, CP3) and each chip with 8 cores. This performance graph shows that after about 500 cycles, the temperature begins to increase about 5° C. In comparison, FIG. 7b shows a performance graph of a package of eight cores manufactured in accordance with aspects of the present invention, e.g., a decreased thermal interface gap. This performance graph shows that after about 1250 cycles, the temperature still remains about the same. In this way, the package manufactured in accordance with the present invention achieves an increased thermal performance. For example, the present invention provides improved thermal resistance over existing technology of about 50% by reducing the thermal interface gap.

Figure 8:
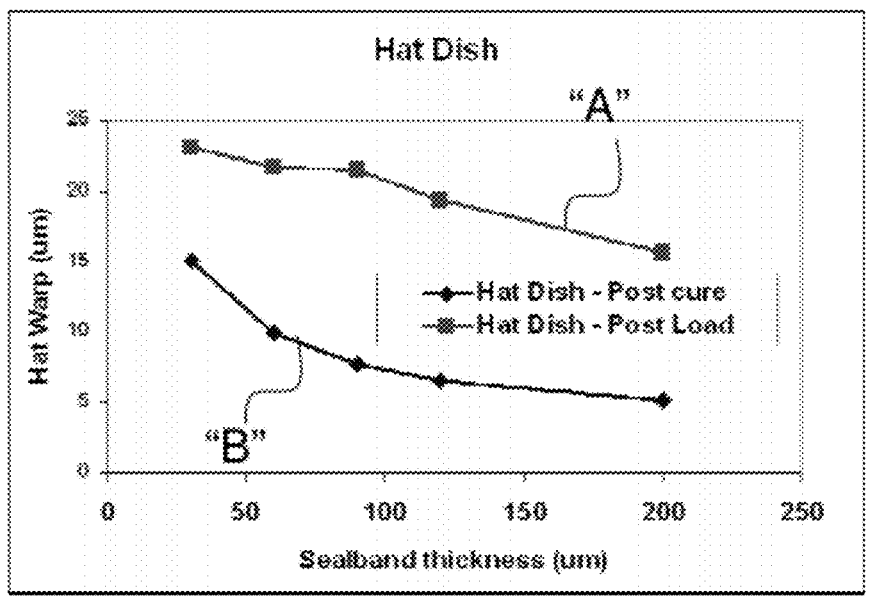
FIG. 8 shows a graph of lid warpage vs. sealant (seal band) thickness.

FIG. 8 shows a graph of lid warpage vs. sealant (seal band) thickness. This graph shows that lid warpage is a function of sealant thickness. For example, less warpage of the lid occurs as the sealant thickness is increased, both in the post cure and post load situations. More specifically, the lid warpage is significantly reduced at a sealant thickness of 200 microns, compared to a sealant thickness of 50 microns. As should be understood, the sealant thickness can be adjusted by using the seal shim of the present invention.

Figure 9:
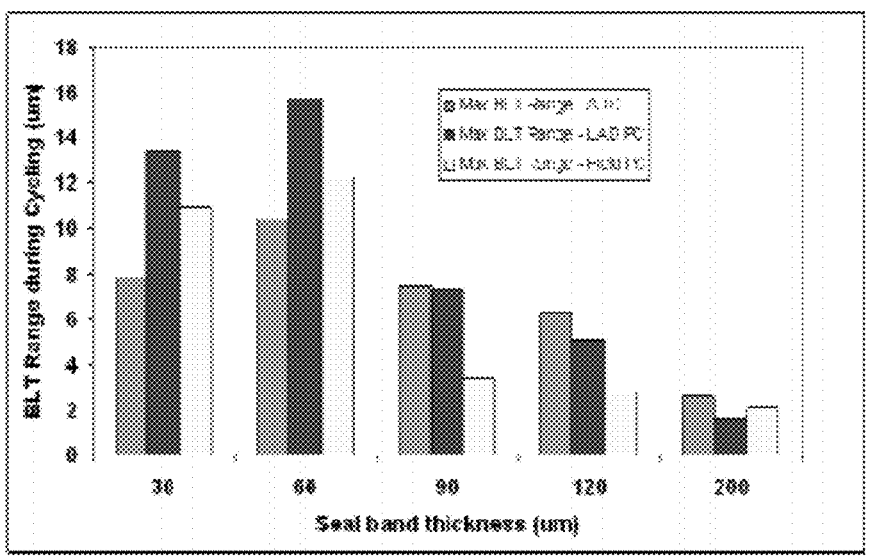
FIG. 9 shows a graph comparing module TIM movement ("pumping") and sealant thickness for lid pumping during accelerated thermal cycling (ATC), lab power cycling and field-use power cycling.

FIG. 9 shows module TIM movement ("pumping") comparison graph for pumping during accelerated thermal cycling (ATC), lab power cycling and field-use power cycling. The graph shows bondline thickness (BLT) cycling vs. sealant thickness. More specifically, this graph shows sealant thickness of 30 microns to 200 microns between 0 and 18 micron BLT cycling. As shown in this graph, stress significantly decreases as a function of sealant thickness. More specifically, this graph shows that stress on the package, e.g., carrier decreases as the sealant becomes thicker. As noted above, the sealant thickness can be adjusted by using the seal shim of the present invention.

Figure 10:
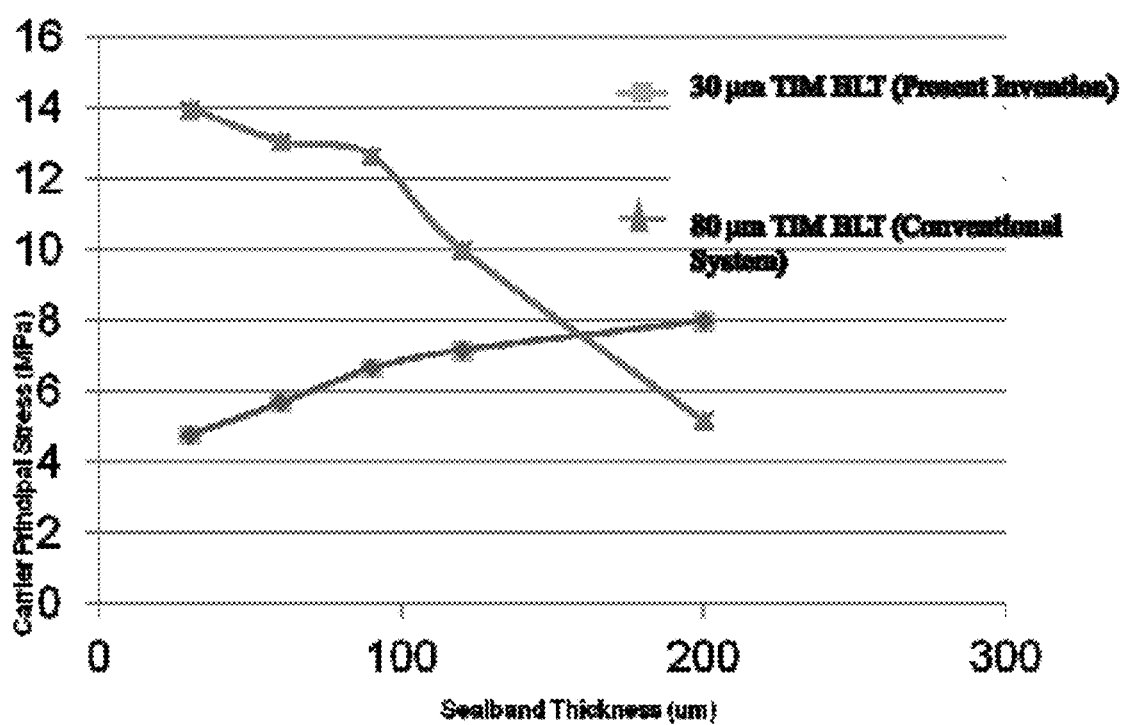
FIG. 10 shows stress analysis in the chip carrier obtained from thermo-mechanical analysis of a conventional multichip electronic package and a multi-chip electronic package in accordance with the present invention.

FIG. 10 shows stress analysis in the carrier obtained from thermo-mechanical analysis of a conventional multi-chip electronic package and a multi-chip electronic package in accordance with the present invention. As shown, the stresses imposed on the conventional multi-chip electronic package (80 μm TIM Gap, 30 μm sealband) are much greater than that imposed on the multi-chip electronic package of the present invention (30 μm TIM Gap, 80 μm sealband). This is due to the use of the seal shim 20, which decouples the lid 14 from the chip carrier 10. More specifically, it is now possible to use a thicker sealant layer between the lid 14 and the chip carrier, by using the seal shim 20.

The method as described above is used in the packaging of integrated circuit chips. The integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method, comprising:
adjusting a piston position of one or more pistons with respect to one or more chips on a chip carrier, the adjusting comprising:
placing a chip shim on the one or more chips on the chip carrier;
placing a seal shim between a lid and the chip carrier, the seal shim being thicker than the chip shim;
lowering the lid until the one or more pistons contact the chip shim;
displacing the one or more pistons and lid individually until full surface contact with both the chip shim and the seal shim is established;
fixing the one or more pistons to the lid in the displaced position;
separating the lid and the chip carrier;
removing the chip shim and the seal shim;
dispensing thermal interface material on the one or more chips and lowering the lid until a gap filled with the thermal interface material between the one or more chips and the one or more pistons is about a particle size of the thermal interface material; and
sealing the lid to the chip carrier with sealant between the lid and the chip carrier.

2. The method of claim 1, further comprising aligning the one or more pistons of the lid in registration with respective one or more chips on the chip carrier.

3. The method of claim 1, further comprising planarizing the one or more pistons with a surface of the lid and fixing the pistons to the lid, prior to the sealing.

4. The method of claim 3, wherein the fixing the pistons to the lid includes cooling solder such that the solder bonds the pistons to the lid.

5. The method of claim 4, further comprising placing the lid and chip carrier in a reflow furnace and heating the solder to release the pistons from the lid.

6. The method of claim 1, wherein the gap is initially formed during the adjusting and then decreased by continuing to lower the lid until the thermal interface material is compressed to the particle size.

7. The method of claim 1, further comprising lowering the lid until the thermal interface material is compressed within the gap to the particle size.

8. The method of claim 7, wherein the gap is about 30 microns.

9. The method of claim 7, wherein a seal space setup by the seal shim prevents the lid from bottoming out on a surface of the chip carrier.

10. The method of claim 1, wherein the seal shim is placed away from the one or more chips and is about twice the thickness of the chip shim.

11. The method of claim 1, wherein the seal shim is fixed to the lid or the chip carrier prior to the lowering of the lid.

12. The method of claim 1, wherein:
the one or more pistons are placed in direct physical contact with the chip shim;
the one or more pistons are fixed to the lid in a position in which the pistons were in direct physical contact with the chip shim;
a surface of the one or more pistons is planarized to a surface of the lid, which is opposing a surface which was in direct physical contact with the chip shim;
a gap dimension of the gap is at least partly determined by a thickness of the seal shim and the particle size of the thermal interface material; and the sealing the lid to the chip carrier includes applying the sealant to either the lid or the chip carrier prior to lowering of the lid.

13. The method of claim 1, wherein the chip carrier and the lid are one of non-hermetically sealed and hermetically sealed module.

14. A method, comprising:
placing a seal shim on at least one of a lid and a chip carrier;
placing a chip shim over chips on the chip carrier;
placing the lid and the chip carrier in proximity to one another such that pistons of the lid are in registration with chips on the chip carrier, with the seal shim preventing the lid from contacting with the chip carrier;
contacting the pistons with the chip shim;
fixing the pistons to the lid in a contacted position with the chips;
moving apart the lid and the chip carrier;
removing the seal shim and the chip shim;
dispensing thermal interface material on the chips;
placing sealant on at least one of the lid and the chip carrier;
moving the lid and the chip carrier together to compress the thermal interface material to a particle size between the pistons and all of the chips; and
sealing the lid to the chip carrier with sealant.

15. The method of claim 14, further comprising planarizing the pistons with a surface of the lid after the pistons contact the chip shim, and fixing the pistons to the lid.

16. The method of claim 14, wherein the fixing the pistons to the lid includes one of:
cooling solder to the pistons and to the lid; and
applying an adhesive to the pistons and the lid.

17. The method of claim 14, wherein a seal space setup by the seal shim and position of the pistons prevents the lid from contacting the chip carrier during the sealing.

18. The method of claim 14, further comprising preventing the lid from contacting the chip carrier when the lid is sealed to the chip carrier.

19. A structure comprising:
a lid encapsulating at least one chip mounted on a chip carrier; and
a gap between pistons of the lid and respective ones of the chips being a particle size of thermal interface material positioned within the gap, the thermal interface material contacts the pistons and the respective ones of the chips,
wherein the gap is defined by a removable seal shim position between the lid and the chip carrier and a removable chip shim positioned on the at least one chip.

20. The structure of claim 19, wherein the chip carrier and the lid are one of non-hermetically sealed and hermetically sealed module.

21. The method of claim 1, wherein:
the seal shim is placed near an outside edge of the lid; and
the removing the chip shim and the seal shim is performed after the displacing the one or more pistons and the lid.

22. The method of claim 21, wherein after the sealing the lid to the chip carrier the entire lid is raised above the one or more chips.

23. The structure of claim 19, wherein the lid is directly sealed to the chip carrier with a sealant between the lid and the chip carrier.

24. The structure of claim 23, wherein a bottom surface of the lid is in contact with the sealant and a top surface of the chip carrier is in contact with the sealant.

* * * * *